United States Patent [19]

Morris et al.

[11] Patent Number: 5,369,042
[45] Date of Patent: Nov. 29, 1994

[54] ENHANCED PERFORMANCE BIPOLAR TRANSISTOR PROCESS

[75] Inventors: Francis J. Morris, Plano; Jau-Yuann Yang, Richardson; Donald L. Plumton; Han-Tzong Yuan, both of Dallas, all of Tex.

[73] Assignee: Texas Instruments Incorporated, Dallas, Tex.

[21] Appl. No.: 26,886

[22] Filed: Mar. 5, 1993

[51] Int. Cl.$^5$ .......................................... H01L 21/265
[52] U.S. Cl. .......................................... 437/31; 437/55; 437/133; 148/DIG. 72
[58] Field of Search .................... 437/31, 133, 59, 55, 437/51; 148/DIG. 72

[56] References Cited

U.S. PATENT DOCUMENTS

| | | | |
|---|---|---|---|
| 3,638,079 | 1/1972 | Chan | 437/55 |
| 3,702,428 | 11/1972 | Schmitz et al. | 437/55 |
| 4,087,900 | 5/1978 | Yiannoulos | 437/55 |
| 4,573,064 | 2/1986 | McLevige et al. | 357/16 |
| 4,672,414 | 6/1987 | Gabriel et al. | 357/34 |
| 4,997,776 | 3/1991 | Harame et al. | 437/55 |
| 5,068,756 | 11/1991 | Morris et al. | 357/16 |
| 5,162,252 | 11/1992 | Kanda et al. | 437/55 |

FOREIGN PATENT DOCUMENTS

| | | | |
|---|---|---|---|
| 0164560 | 10/1982 | Japan | 437/55 |
| 0087851 | 5/1984 | Japan | 437/55 |

OTHER PUBLICATIONS

Tully, et al., "A Fully Planar Heterojunction Bipolar Transistor", *IEEE Electron Device Letters*, vol. EDL-7, No. 11, Nov. 1986, pp. 615-617.
John W. Tully, "Heterojunction Bipolar Transistors with Ion-Implanted Bases", *IEEE Electron Device Letters*, vol. EDL-7, No. 4, Apr. 1986, pp. 203-205.
Tran, et al., "GaAs/AlGaAs Heterojunction Emitter--Down Bipolar Transistors Fabricated on GaAs-on-Si Substrate", *IEEE Electron Device Letters*, vol. EDL-8, No. 2, Feb. 1987, pp. 50-52.
Nagata, et al., "Self-Aligned AlGaAs/GaAs HBT with Low Emitter Resistance Utilizing InGaAs Cap Layer", *IEEE Transactions on Electron Devices*, vol. ED-35, No. 1, Jan. 1988, pp. 2-7.

Primary Examiner—Tom Thomas
Assistant Examiner—Tuan Nguyen
Attorney, Agent, or Firm—Dana L. Burton; Richard A. Stoltz; James C. Kesterson

[57] ABSTRACT

This is a method of forming a bipolar transistor comprising: forming a subcollector layer, having a doping type and a doping level, on a substrate; forming a first layer, of the same doping type and a lower doping level than the subcollector layer, over the subcollector layer; increasing the doping level of first and second regions of the first layer; forming a second layer, of the same doping type and a lower doping level than the subcollector layer, over the first layer; increasing the doping level of a first region of the second layer which is over the first region of the first layer, whereby the subcollector layer, the first region of the first layer and the first region of the second layer are the collector of the transistor; forming a base layer over the second layer of an opposite doping type than the subcollector layer; and forming an emitter layer of the same doping type as the subcollector layer over the base layer. Other devices and methods are also disclosed.

19 Claims, 5 Drawing Sheets

ENHANCED PERFORMANCE BIPOLAR TRANSISTOR PROCESS

FIELD OF THE INVENTION

The present invention generally relates to semiconductor electronic integrated circuits, and, more particularly, to integrated circuits including bipolar devices.

BACKGROUND OF THE INVENTION

Without limiting the scope of the invention, its background is described in connection with, bipolar transistors as an example.

Heretofore, in this field, GaAs/AlGaAs heterojunction bipolar transistors (HBT) have been fabricated using mesa technology in which the collector, base and emitter epi layers are subsequently grown during a single epitaxial deposition run. The emitter and base epi layer are selectively removed using two etch steps for making contact to the base and collector areas, respectively. These etches result in steps in the GaAs ranging in height between 0.4 and 2.0 microns for a typical mesa HBTs. Although high quality HBTs can be fabricated in this manner, the resulting mesa structure results in very severe topography making it difficult to incorporate a multilevel metal system as required for high levels of integration.

Planar heterojunction bipolar transistors have been fabricated as elements of integrated circuits in the emitter down configuration (See U.S. Pat. No. 4,573,064). This avoids the mesa topography but this technology requires all of the NPN transistors to be connected in the common emitter configuration which severely limits its applications for analog/linear ICs.

Although a single epitaxial deposition run as used in the foregoing mesa HBTs and emitter-down HBTs does simplify the fabrication process, it limits the types of structures which can be integrated together on a single chip.

An alternative has been to grow an emitter epilayer onto an implanted base with Zn as the base dopant because of the high mass and low implant range. However, implanted Zn is difficult to activate at low temperatures. Raising the temperature high enough for good activation results in excessive diffusion due m the large diffusion coefficient for Zn, significantly increasing the base width and lateral dimensions and degrading the frequency response. Additionally, this process integrates only a single type of device, the NPN HBT.

Improved performance as well as increased circuit flexibility has been made possible by integrating both NPN and PNP bipolar transistors on the same chip. Silicon digital circuits make use of vertical NPN switching transistors and PNP transistors for input logic, current sources and level shifting. Silicon linear circuits are routinely using integrated NPN and PNP transistors for improved circuit performance.

SUMMARY OF THE INVENTION

The present invention provides devices, integrated circuits and fabrication processes which include more than one epitaxial deposition but provides NPN, PNP or simultaneously both NPN and PNP bipolar transistors. This invention eliminates in conventional mesa heterojunction bipolar transistors the requirement to etch down to the subcollector for making contact and the resulting severe surface topography which can result in poor yields in multilevel metal VLSI circuits. In a preferred embodiment, a GaAs wafer is deposited with an epitaxial film which may be made of several sequential doped layers; the wafer is selectively implanted with suitable dopants and/or etched selectively. After this processing the wafer is preferably cleaned and a second epitaxial layer is deposited. The number of epitaxial layers deposited may be varied as needed. The implant/etch processes followed by epitaxial deposition may be repeated a number of times. The specific epitaxial deposition process may be MOCVD, MBE, MOMBE or other deposition processes.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

A heterojunction bipolar transistor (HBT) is described in the following embodiments as an example of the present invention. However, it should be realized that the processes described may be useful in the fabrication of any bipolar transistor. The steps described could be used when fabricating a bipolar transistor of different materials with different dopants, different dopant concentrations, different layer thicknesses, etc. For example, the processes described could be used to make a silicon bipolar transistor. While the process described in the first embodiment is based on an NPN transistor, the same process could be used to form a PNP transistor. Also, the second embodiment process is described beginning in the same manner as the first embodiment NPN transistor. However, if desired the process could begin with the PNP transistor formation with the NPN transistor being formed in a manner similar to that of the PNP transistor formation in the second embodiment described below. Refer to Table 1 for example values of layer thicknesses and doping levels for both embodiments described below.

The process flow of a first preferred embodiment of the present invention is illustrated in FIGS. 1a–e. The process utilizes overgrowth to bring the collector contact area to the surface and shallow etching ($\approx 3000$ Å) to contact the base and emitter regions. This process employs overgrowth at the collector-base interface rather than at the more critical emitter-base interface as described in U.S. Pat. No. 5,068,756.

Figure 1A:
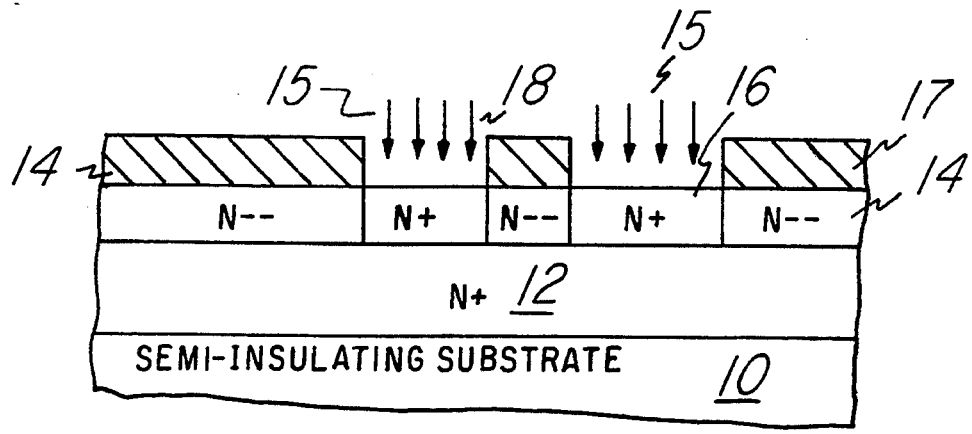
FIG. 1a–1e are cross-sectional views, at different processing stages, of a first preferred embodiment of this invention.

The collector of the bipolar transistor of the first preferred embodiment is significantly different from that of the standard microwave HBT process. Referring to FIG. 1(a), the process preferably starts with a semi-insulating GaAs substrate 10 onto which a preferably 1-$\mu$m N+ GaAs subcollector 12 and a preferably 0.6-$\mu$m N− GaAs layer 14 are grown, for example by MOCVD. The N− doping, preferably approximately 5E14-2E16, is chosen such that it will be mostly depleted even at zero collector-base bias. As an example, silicon 15 is selectively implanted into the collector contact area 16 and into the region 18 which will be directly under the emitter contact area to change the N− doping in these areas to N+. These implanted regions will be extensions of the N+ collector 12. (Note that portions of layers 12,14, and 20 together form the final N+ collector 12).

Figure 1B:
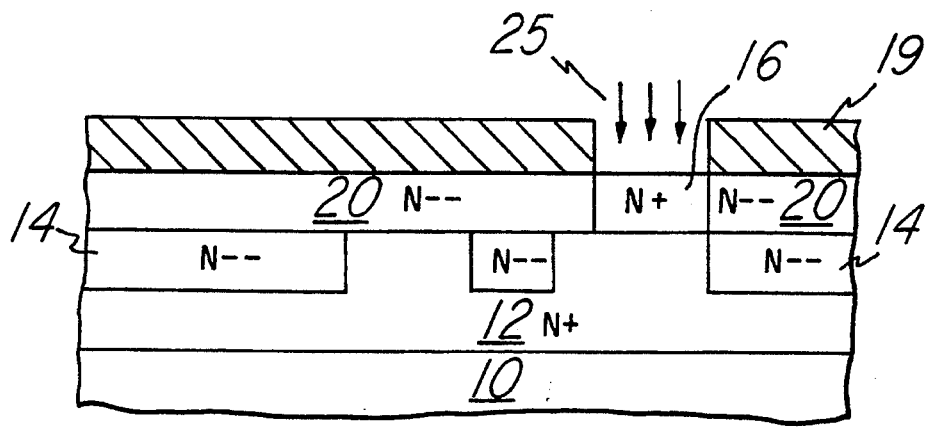
Figure 1C:
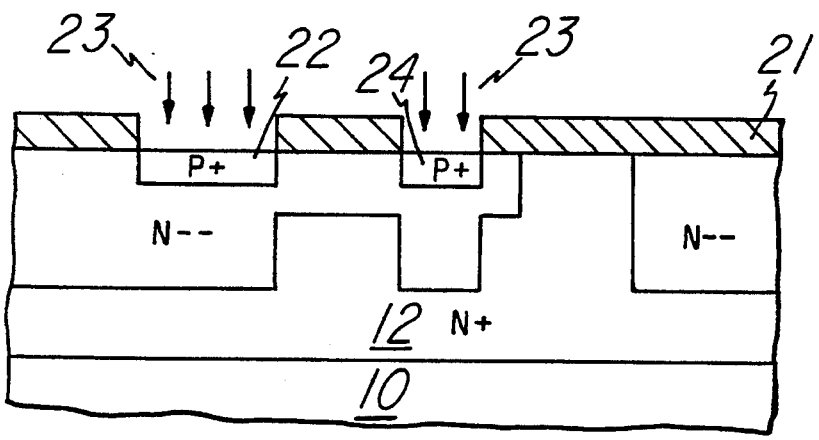

Referring to FIG. 1(b), after annealing the silicon implants a second N− collector layer 20 is overgrown using preferably MOCVD. A second silicon implant 25 is used in the collector contact area 16 to bring the N+ region to the top of the surface. As an example, beryllium 23 may be selectively implanted into the surface to form buried P+ extrinsic base regions 22,24 [FIG. 1(c)]. The hole in the donut shaped extrinsic base implant pattern will determine the size of the intrinsic transistor. FIGS. 1 (a), 1(b), and 1(c) each show a layer of resist 17, 19, and 21, respectively, that may be used as a mask during implanting steps and later removed. Any comparable method of masking and/or implanting may be used. As an alternative to implanting the buried P+ layer 22,24, the p-type dopant can be diffused from an appropriate source such as zinc oxide using either of several conventional selective masking techniques. Another alternative is to grow, at this point in the process, a P+ carbon doped GaAs layer as an epi deposition and selectively etching it away except in regions where the buried P+ region 22, 24 is desired. The P+ buried regions 22,24 may also be selectively grown at this point.

Figure 1D:
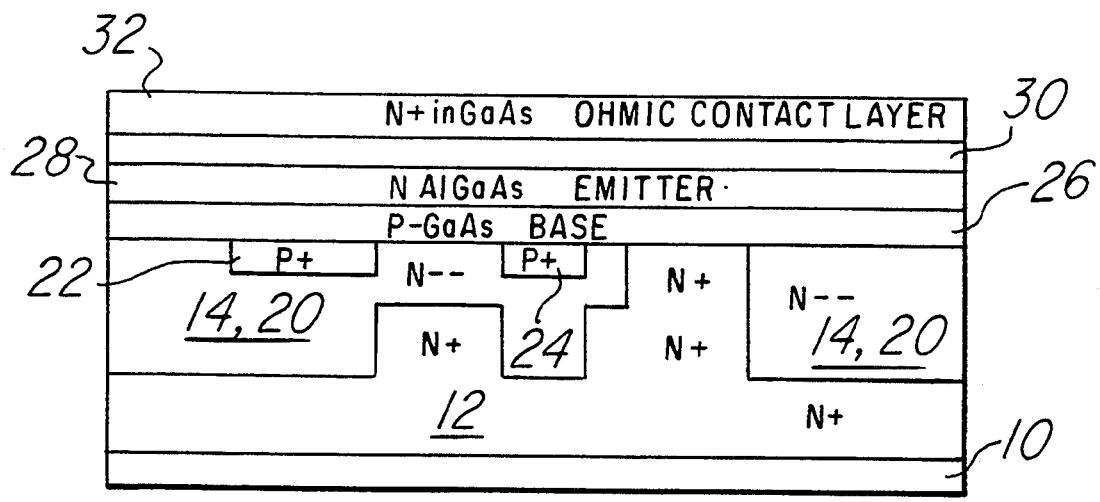
Figure 1E:
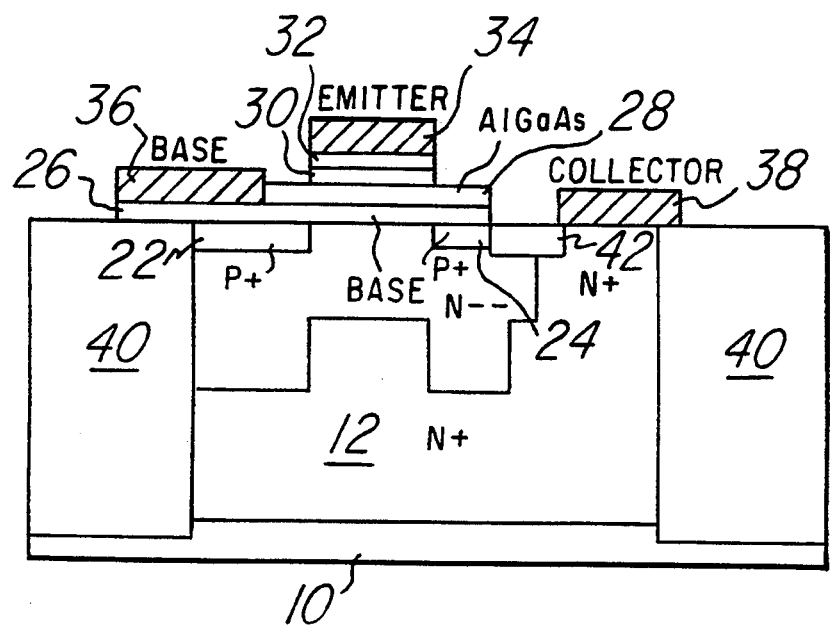

Referring to FIG. 1(d), the base 26 and emitter layers 28 are then overgrown onto the wafers using, for example, MOCVD. In this example, the base layer 26 is preferably P− carbon doped GaAs and the emitter layer 28 is preferably N AlGaAs. One or more grading layers 30 and an ohmic contact layer 32 may be used to improve emitter contact. In this example, the grading layers 30 are preferably graded from AlGaAs ($Al_xGa_{1-x}As$) to GaAs to InGaAs and the ohmic contact layer 32 is preferably N+ InGaAs.

From this point in the process the wafers may be processed in a manner similar to mesa HBTs. Referring to FIG. 1 (e), the emitter metal contact pattern is preferably aligned to the hole in the extrinsic base implant pattern (buried P+) and using lift off the emitter contact 34 is formed. This metal contact 34 may be used as a mask to etch down to the base layer 26. This etch step is far less critical than for a microwave mesa base etch step since a buffed P+ layer 22 extends the thickness of the base in the contact area 36 allowing for some over etching. After etching the base layer 26 from the field region the collector ohmic contact 38 is made to the N+ implanted collector region 12. The transistor is then preferably isolated using 5 meV oxygen implants 40, for example. Boron 42 may be selectively implanted to improve the isolation between the HBT base and collector contact area and to reduce capacitance.

The advantages of the first preferred embodiment process include:
   Reduced collector-base capacitance without the use of implant damage which can anneal out. The thick n− epi under the base contact and extrinsic base region will result in lower collector-base capacitance than can be obtained using implant damage.
   Improved base contact yields because of thicker extrinsic base layer resulting from the buried P+ implant which allows noncritical etching and metal contacts to the base.
   Improved current gains through the use of a less heavily doped intrinsic base epitaxial layer, since there is reduced base resistance resulting from the buried P+ extrinsic base.
   Mesa etching down to the N+ collector is not required since an N+ implanted plug brings the N+ collector contact region to the surface.
   Improved collector-emitter breakdown voltage.

The process flow of a second preferred embodiment of the present invention is illustrated in FIGS. 2a–e. As an example, this process provides a complementary NPN/PNP bipolar transistor process that can significantly reduce the power consumption and minimize the thermal gradients within the die for improved SNRs. The use of both high-speed NPNs and PNPs can simplify circuit design, reduce chip size and significantly improve circuit performance. This is illustrated by nearly all high-speed, high resolution silicon bipolar circuits using both high-speed NPNs and moderate-speed PNPs for these reasons. It has been demonstrated that the GaAs/AlGaAs PNP HBT can be fabricated with performance nearly equal to that of its NPN counterpart. The addition of complementary high-speed bipolar circuits will open up the field of high-speed linear GaAs circuits. The complementary bipolar transistor process results in NPN and PNP HBTs that can be integrated into a planar process and used as needed without the requirement that all of one type of transistor appear in only one area of a chip and the second type appear in only a second area.

Figure 2A:
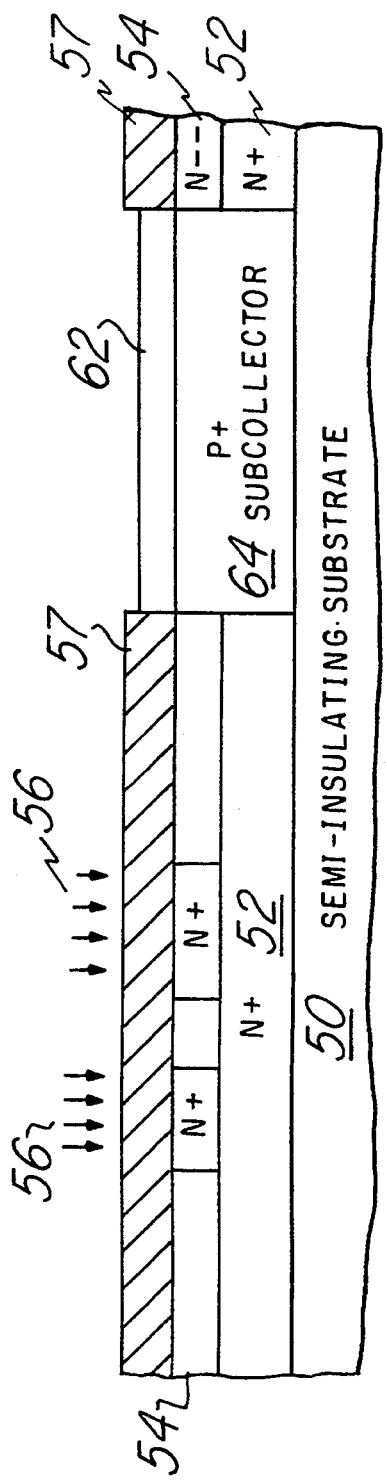
FIG. 2a–2e are cross-sectional views, at different processing stages, of a second preferred embodiment of this invention.

The complementary bipolar transistor process of the second preferred embodiment uses one additional overgrowth process compared to the process of the first preferred embodiment. Starting wafers may be the same as the first preferred embodiment process [FIG. 2(a)]. Referring to FIG. 2(a), the process preferably starts with a semi-insulating substrate 50 onto which a preferably 1-μm N+ GaAs subcollector 52 and a preferably 0.6-μm N− GaAs layer 54 are grown, for example by MOCVD. The N− doping, preferably approximately 5E14-2E16, is chosen such that it will be mostly depleted even at zero collector-base bias. As an example, silicon 56 is selectively implanted into the collector contact area 58 and into the region 60 which will be directly under the emitter contact area to change the N− doping in these areas to N+. These implanted regions will be extensions of the N+ collector 52. (Note that portions of layers 62, 54, and 66 together form the final NPN N+ collector 52 and other portions of the same layers form the final PNP P+ collector 64). In regions where PNP transistors are to be grown, a dopant source such as zinc oxide 52 is preferably selectively patterned and diffused into the waters converting portions of the N− collector 54 and N+ subcollector 52 to form the P+ subcollector 64. As an alternative to the use of a dopant source and diffusion to convert the N− collector and N+ collector to a P+ subcollector, selective implantation of a p-type dopant such as beryllium can be used. The first epi overgrowth may be the same as in the first preferred embodiment process.

Figure 2B:
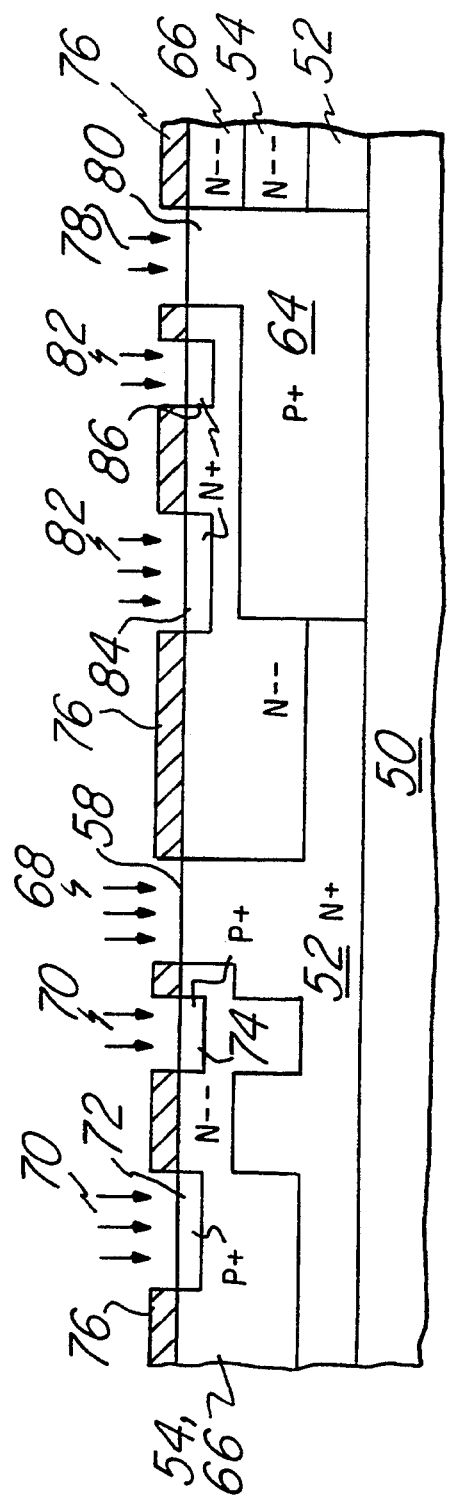
Figure 2C:
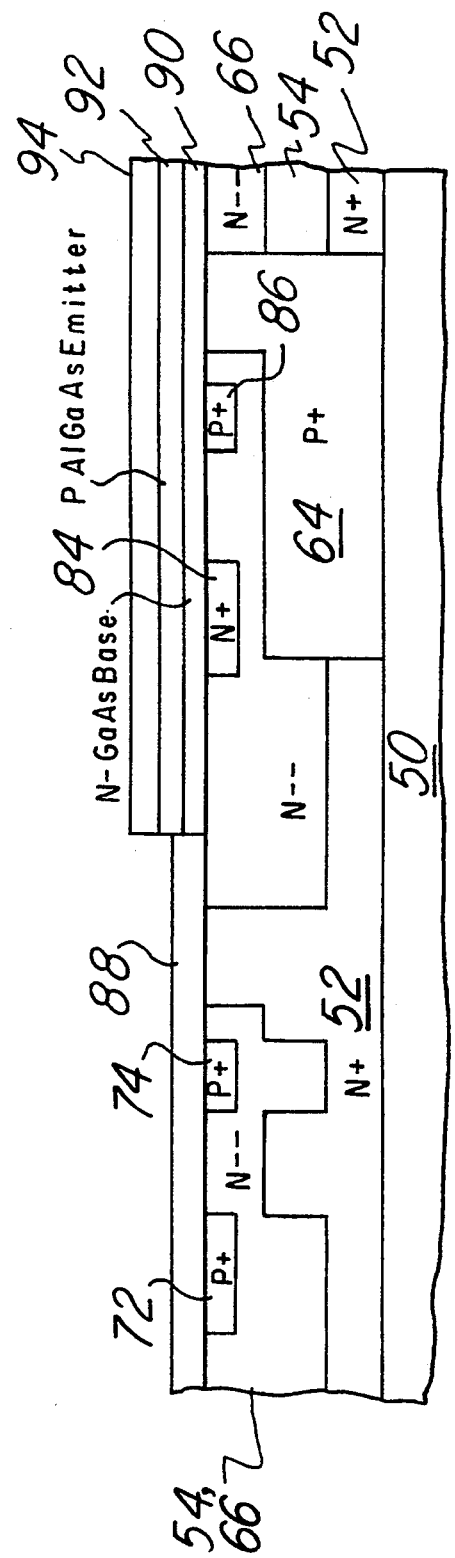

Referring to the NPN portion of FIG. 2(b), after annealing the silicon implants 56 a second N− collector layer 66 is overgrown using preferably MOCVD. A second silicon implant 68 is used in the collector contact area 58 to bring the N+ region to the top of the surface. As an example, beryllium 70 may be selectively implanted into the surface to form buried P+ extrinsic base regions 72,74. The hole in the donut shaped extrinsic base implant pattern will determine the size of the intrinsic transistor. FIGS. 2(a), 2(b), and 2(c) each show a layer of resist, such as nitride, 57, 76, and 88, respectively, that may be used as a mask during implanting steps and later removed. Any comparable method of masking and/or implanting may be used. Another alternative is to grow, at this point in the process, a P+ carbon doped GaAs layer as an epi deposition and selectively etching it away except in regions where the buried P+ region 72, 74 is desired. The P+ buried regions 72,74 may also be selectively grown at this point. Referring to the PNP portion of FIG. 2(b), similar to the NPN process, beryllium 78 is preferably implanted into the overgrowth layer 66 forming the P+ plug 80 for the PNP collector 64 surface contact. Silicon 82 is preferably implanted into the PNP extrinsic base region forming a buried N+ region 84,86 similar to the buried P+ region 72,74 in the NPN. The alternative methods described for forming the P+ buried regions 72,74 may be used to form the N+ buried regions 84,86.

Figure 2D:
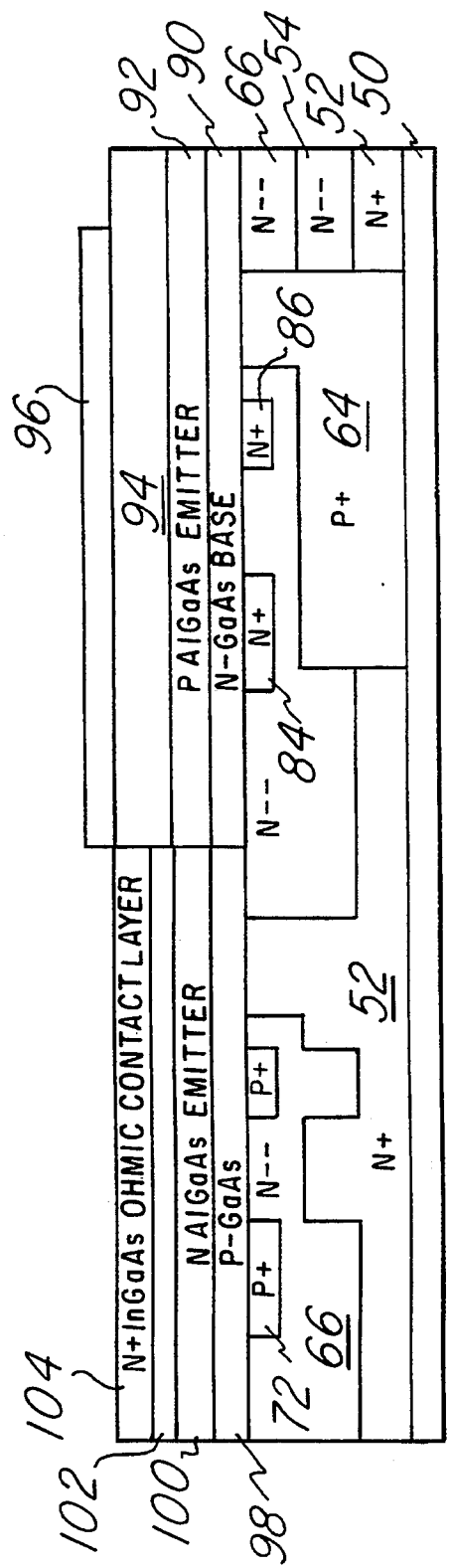

Referring to FIG. 2(c), the NPN HBTs are then preferably selectively covered by a material 88 such as nitride exposing the field and the PNP HBTs. The PNP base 90, preferably Si doped N− GaAs, and emitter 92, preferably carbon doped AlGaAs, epitaxial layers are preferably grown by MOCVD. A grading layer 94 graded from AlGaAs to GaAs may be used to improve emitter contact formation. Referring to FIG. 2(d), after removing the protective nitride 88 over the NPNs, the PNP HBTs are protected, preferably with nitride 96, and the NPN HBT base 98, and emitter 100 layers are grown preferably by MOCVD. In this example, the base layer 98 is preferably P− carbon doped GaAs and the emitter layer 100 is preferably N AlGaAs. One or more grading layers 102 and an ohmic contact layer 104 may be used to improve emitter contact, In this example, the grading layers 30 are preferably graded from AlGaAs ($Al_xGa_{1-x}As$) to GaAs to InGaAs and the ohmic contact layer 32 is preferably N+ InGaAs. Excellent selectivity has been demonstrated using this process.

Figure 2E:
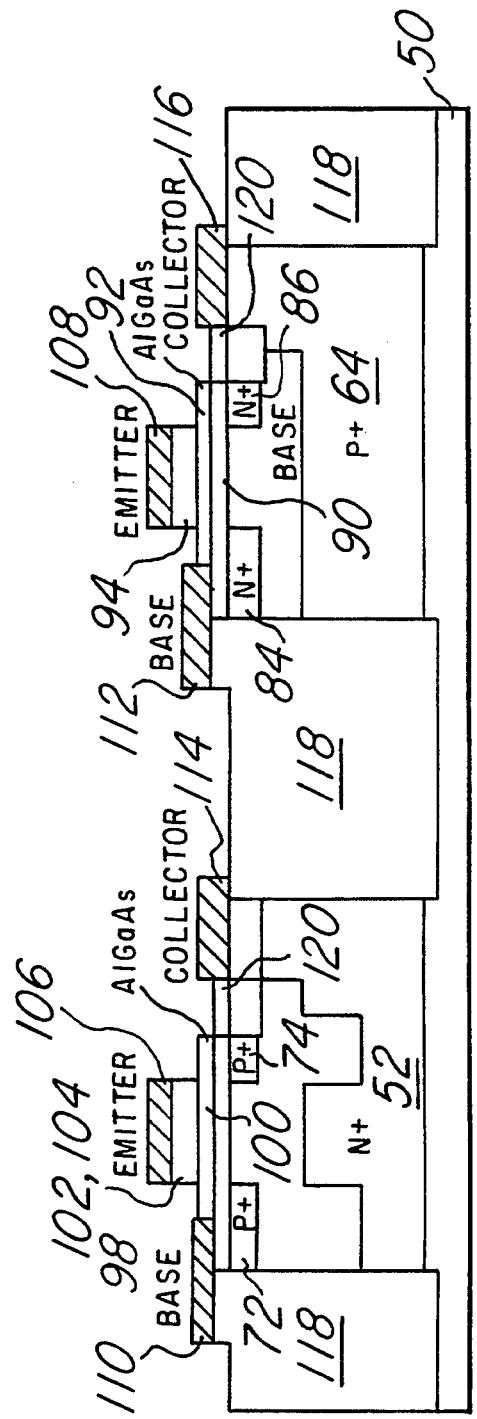

After growth of NPN and PNP HBT layers the emitter, base and collector layers are preferably contacted in the same manner as described in the first preferred embodiment process. Referring to FIG. 2(e), the emitter metal contact pattern is preferably aligned to the hole in the extrinsic base implant pattern (buried P+ and N+) and using lift off the emitter contacts 106,108 are formed. These metal contacts 106,108 may be used as a mask to etch down to the base layers 90,98. This etch step is far less critical than for a microwave mesa base etch step since a buried P+ 72 and N+ 84 layer extends the thickness of the base 90,98 in the contact areas 110,112 allowing for some over etching. After etching the base layers 90,98 from the field region the collector ohmic contacts 114,116 are made to the implanted collector regions 52,64. The transistor is then preferably isolated using, for example, oxygen implants 118 and boron 120.

The advantages of the planar NPN/PNP bipolar transistor process over the standard mesas approach include:

Access to the NPN and PNP collector contacts can be obtained without etching mesas down to the collectors for improved interconnect yields.

Enhanced NPN because of reduced c-b capacitance.

Improved yields because of thicker extrinsic base layer for etching and contacting the base. This is particularly important for the PNPs which typically utilize thinner base layers than NPNs to improve performance.

A preferred embodiment has been described in detail hereinabove. It is to be understood that the scope of the invention also comprehends embodiments different from those described, yet within the scope of the claims. For example, the buffed P+ and/or buried N+ regions can be omitted from the process for process simplification. Additionally, the N type dopant, while preferably silicon, could be a material such as S, or Se. Alternatives for the P type dopant include, for example, carbon and zinc. Similarly, the GaAs could be replaced with a material such as InGaAs, InP, or GaInP and the AlGaAs could be replaced with GaInP or InP. In addition, the use of implantation and diffusion from appropriate sources can be used interchangeably as the technologies evolve. Alternatively, this invention could be realized in other materials, silicon for example. While the epitaxial deposition process suggested above is MOCVD, other processes may be used, for example, MBE or MOMBE. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| ELEMENT NO. | LAYER NAME | LAYER THICKNESS ($\mu M$) | DOPANT LEVEL ($cm^3$) |
|---|---|---|---|
| 12,52 | N+ subcollector | 0.6–2.0 | 1E18–1E19 |
| 14,54 | 1st N− collector | 0.3–1.0 | 1E15–5E16 |
| 20,66 | 2nd N− collector | 0.3–1.0 | 1E15–5E16 |
| 26,98 | NPN base | .02–0.2 | 1E18–1E20 |
| 28,100 | NPN emitter | .02–0.2 | 1E17–5E18 |
| 30,102 | NPN cap layer | .05–0.4 | 1E18–1E19 |
| 32,104 | InGaAs cap layer | .02–0.1 | 1E18–1E20 |
| 90 | PNP base | .02–0.2 | 1E18–5E18 |
| 92 | PNP emitter | .02–0.2 | 1E17–1E20 |
| 94 | PNP cap layer | .05–0.4 | 1E18–1E20 |

What is claimed is:

1. A method of forming complementary NPN and PNP bipolar transistors comprising:

a. forming a n-type subcollector layer, having a doping concentration, on a substrate;

b. forming a n-type first layer, of a lower doping concentration than said subcollector layer, over said subcollector layer;

c. increasing said doping concentration of first and second regions of said first layer in an NPN transistor area;

d. counter-doping portions of said n-type subcollector and said n-type first layer, thereby forming a p-type subcollector in a PNP transistor area;

e. forming a n-type second layer, of a lower doping concentration than said n-type subcollector layer, over said first layer;

f. increasing said doping concentration of a first region of said second layer which is over said first region of said first layer, whereby said subcollector layer, said first region of said first layer, and said first region of said second layer are a collector of an NPN transistor;

g. counter-doping a second region of said second layer in said PNP portion of said transistor, whereby said p-type subcollector and said second region of said second layer are a collector of a PNP transistor;

h. forming a n-type base layer over said second layer in said PNP transistor area;

i. forming a p-type emitter layer over said n-type base layer;

j. forming a p-type base layer over said second layer in said NPN transistor area; and k. forming an n-type emitter layer over said p-type base layer.

2. The method of claim 1, wherein said subcollector layer, said first layer and said second layer are GaAs.

3. The method of claim 1, wherein said subcollector layer, said first layer and said second layer are Si.

4. The method of claim 1, wherein said n-type and said p-type base layers are GaAs.

5. The method of claim 1, wherein said n-type and said p-type emitter layers are AlGaAs.

6. The method of claim 1, further comprising grading layers over said p-type and said n-type emitter layer.

7. The method of claim 1, wherein said NPN and PNP transistors are isolated.

8. The method of claim 7, wherein said isolation is done by oxygen implants.

9. The method of claim 1, wherein base and collector contact areas are isolated.

10. The method of claim 9, wherein said isolation is done with a boron implants.

11. The method of claim 1, further comprising forming base, emitter, and collector contacts.

12. The method of claim 1, further comprising the step of forming p-type extrinsic base regions before forming said p-type base layer and not over said first and second regions of said first layer in said NPN transistor area.

13. The method of claim 12, wherein said p-type extrinsic base region is implanted into said second layer.

14. The method of claim 12, wherein said p-type extrinsic base is grown over said second layer and selectively removed.

15. The method of claim 12, wherein said p-type extrinsic base is selectively grown over said second layer.

16. The method of claim 1, further comprising the step of forming n-type extrinsic base regions before forming said n-type base layer and not over said second region of said second layer in said PNP transistor area.

17. The method of claim 16, wherein said n-type extrinsic base region is implanted into said second layer.

18. The method of claim 16, wherein said n-type extrinsic base is grown over said second layer and selectively removed.

19. The method of claim 16, wherein said n-type extrinsic base is selectively grown over said second layer.

* * * * *